United States Patent [19] [11] 4,370,386
Uekita et al. [45] Jan. 25, 1983

[54] REINFORCED UNSATURATED POLYESTER RESIN LAMINATE

[75] Inventors: Masakazu Uekita, Kobe; Yasuo Fushiki, Takatsuki; Masaharu Abe, Kobe, all of Japan

[73] Assignee: Kanegafuchi Kagaku Kogyo Kabushiki Kaisha, Osaka, Japan

[21] Appl. No.: 189,860

[22] Filed: Sep. 15, 1980

[30] Foreign Application Priority Data

Sep. 19, 1979 [JP] Japan ............................. 54-121180

[51] Int. Cl.³ ...................... B32B 15/08; B32B 15/12; B32B 27/04; B32B 27/42
[52] U.S. Cl. ................................. 428/458; 428/460; 428/464; 428/481; 428/482; 428/526; 428/530
[58] Field of Search ............... 428/481, 436, 500, 458, 428/460, 464, 482, 530, 526; 156/332, 330, 324

[56] References Cited

U.S. PATENT DOCUMENTS

| | | | |
|---|---|---|---|
| 2,632,744 | 3/1953 | Howald | 428/48 X |
| 2,931,749 | 4/1960 | Kine et al. | 156/332 X |
| 2,985,615 | 5/1961 | Tunteler | 428/500 X |
| 3,897,588 | 7/1975 | Nohtomi | 428/436 |
| 3,902,951 | 9/1975 | Doi et al. | 156/330 X |
| 4,087,300 | 5/1978 | Adler | 156/324 X |

OTHER PUBLICATIONS

Halox Pigments–Products Specification sheet for Halox®ZX-111 (Zinc Phosphosilicate).

Primary Examiner—Thomas J. Herbert, Jr.
Attorney, Agent, or Firm—Haight & Associates

[57] ABSTRACT

An electrical laminate comprising layers of an unsaturated polyester resin-impregnated fibrous cellulosic substrate is disclosed. The substrate is preimpregnated with a mixture and/or a condensate of an aminoplast with a higher fatty derivative having at least one functional group capable of condensation with the methylol group of aminoplast. The laminate exhibits improved moisture resistance and punchability.

7 Claims, No Drawings

REINFORCED UNSATURATED POLYESTER RESIN LAMINATE

BACKGROUND OF THE INVENTION

This invention relates to an electrical laminate. Reinforced unsaturated polyester resin laminates find important uses as electrical components such as printed circuit wiring boards. These laminates are conventionally produced by impregnating a fibrous substrate with unsaturated polyester resin (mixture of unsaturated polyester and a cross-linking vinyl monomer), laminating layers of resin-impregnated substrate and curing the resin under heat and pressure.

Cellulosic papers have many advantages as substrate for the production of electrical laminates but they tend to pick up moisture excessively thereby deteriorating in electrical properties of the entire structure. Their affinity to the resin is not necessarily satisfactory.

In an attempt to eliminate these and other defects, Japanese Patent Publication No. 13781/63 proposes to treat the cellulosic substrate with an aminoplast such as methylolmelamines, methylolguanamines and the like. Experiments have shown, however, that this treatment makes the resulting resin laminates to be excessively stiff and thus adversely affects on the impact strength and punchability of the laminates, though decrease in electrical insulation properties and solder dip resistance caused by moisture absorption may be effectively prevented.

SUMMARY OF THE INVENTION

Briefly, in accordance with the present invention, an electrical laminate comprises layers of a cellulosic substrate impregnated with an unsaturated polyester resin. The improvement resides in said cellulosic substrate which has been preimpregnated with a mixture and/or a condensate of an aminoplast with a higher fatty derivative having at least one functional group capable of condensation with the methylol group of aminoplast. The use of said higher fatty derivative in conjunction with aminoplast gives flexibility to the finished laminate so that its punchability and impact strength may be improved yet effectively preventing decrease in electrical and mechanical properties caused by moisture absorption.

DETAILED DESCRIPTION

Examples of cellulosic fibrous substrate which may be used herein include papers made of wood pulp, cotton linter pulp, regenerated cellulose pulp and mixtures thereof, and fabrics made of natural or regenerated cellulose.

Examples of aminoplasts which may be used herein include methylolmelamines, methylolguanamines, methylolureas, methylolethyleneureas and the like. Partially or fully etherified products of these methylol compounds with lower aliphatic alcohols such as methanol, ethanol, propanol or butanol, co-condensates of these methylol compounds and co-condensate of an aminomethylol compound with a methylolphenol may also be used. These aminoplasts may be prepared by reacting amino compounds such as melamine, urea, ethyleneurea, formoguanamine, acetoguanamine, propioguanamine, benzoguanamine and adipoguanamine with formaldehyde, optionally followed by etherifying with lower aliphatic alcohols. Methylolmelamines and methylolguanamines are preferable.

The higher fatty derivatives which may be used herein should have a long hydrocarbon chain and at least one functional group capable of condensation with the methylol group of aminoplast. Examples of such functional group are carboxyl, hydroxyl, amino, amide and the like. Preferably the hydrocarbon chain consists of $C_8$ to $C_{22}$ inclusive of carbonyl carbon atom.

Specific examples of such higher fatty derivative include saturated higher fatty acid such as caprylic acid, capric acid, lauric acid, myristic acid, palmitic acid and stearic acid; unsaturated higher fatty acid such as oleic acid, erucic acid, linoleic acid, eleostearic acid and linolenic acid; partial esters of these saturated or unsaturated fatty acids with polyols such as ethyleneglycol, polyethyleneglycol, propyleneglycol, polypropyleneglycol, glycerine, pentaerythritol, sorbitol and sucrose; amides of said higher fatty acids; saturated and unsaturated higher fatty alcohols such as capryl alcohol, lauryl alcohol, myristyl alcohol, stearyl alcohol, cetyl alcohol, oleyl alcohol and linoleyl alcohol; partial ethers of these higher fatty alcohols with the aforementioned polyols; and amines derived from the aforementioned higher fatty alcohols. Hydroxy fatty acid such as ricinoleic acid and their derivatives of the aforementioned classes may also be used. Oleic acid, oleyl alcohol, oleylamine, oleic amide, glyceryl monooleate and glyceryl dioleate have been found preferable.

Optimum ratio of the higher fatty derivative to aminoplast depends upon the nature of particular unsaturated polyester resin, especially its glass transition point. Generally from 3 to 40 parts by weight of the higher fatty derivative per 100 parts by weight of aminoplast are satisfactory. An amount below this range is not effective to improve the punchability, while excessive amounts adversely affect on the mechanical strength and heat resistance of the finished laminates.

The higher fatty derivative and aminoplast are used in the form of a mixture or a condensate as a solution or suspension in a suitable solvent such as water, lower alkanols, ketones or esters. The concentration of said mixture or condensate is preferably adjusted to obtain a pick-up from 3 to 30% by weight, more preferably from 6 to 20% by weight of the substrate on dry basis. A pick-up below the lower limit is not effective and excessive pick-ups adversely affect on the punchability of finished laminates.

The cellulosic substrate may be preimpregnated with said liquid by any conventional technique such as dipping, coating by a roller coater or spraying. Then the substrate is dried to remove solvent at a temperature from 50° C. to 170° C. for 0.5 to 60 minutes.

Any conventional unsaturated polyester resin composition may be used in the final impregnation of the preimpregnated cellulosic substrate. Preferably the polyester resin is a liquid at room temperature, although a solid resin may also be used in the form of a solution. The resin composition comprises an unsaturated polyester and a cross-linking vinyl monomer. As is wellknown in the art, the unsaturated polyesters are a reaction product of (a) a polyhydric alcohol such as ethyleneglycol, propyleneglycol, diethyleneglycol, 1,4-butanediol, or 1,5-pentanediol with (b) an unsaturated polycarboxylic acid such as maleic anhydride or fumaric acid, and (c) a saturated polycarboxylic acid such as phthalic anhydride, isophthalic acid, terephthalic acid, adipic acid, sebatic acid or azelaic acid. The condensate typically has a recurring unit of the formula:

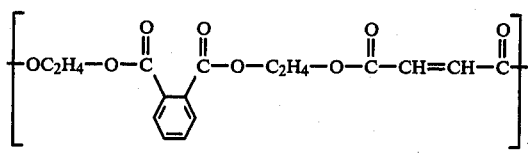

Examples of the cross-linking vinyl monomer include styrene, α-methylstyrene, vinyltoluene, chlorostyrene, divinylbenzene, $C_1-C_{10}$ alkyl acrylate, $C_1-C_{10}$ alkyl methacrylate, diallyl phthalate, triallyl cyanurate and the like. Styrene is most preferable. The resin composition preferably contains about 20 to 50 weight % of the monomer in the entire resin composition and has a viscosity of 0.1 to 30 poise, preferably 0.5 to 15 poise at room temperature. The resin composition also contains a conventional curing catalyst such as organic peroxides and optionally a curing accelerator such as cobalt compounds.

Furthermore, it is preferable that the unsaturated polyester resins have, after curing, a glass transition point from 20° C. to 80° C. The laminates made from these resins exhibit excellent punchability even at a low temperature.

The final impregnation of the substrate with the resin composition and the subsequent steps for lamination and curing may be carried out under heat and pressure in any conventional manner which is well-known in the art, or in continuous manner without applying pressure as disclosed in a co-pending application of Masana Gotou et al, Ser. No. 06/132,500, filed Mar. 21, 1980, assigned to the same assignee as the present application.

If a clad laminate is desired, a cladding metal foil such as electrolytic copper foil may be adhesively bonded onto one or both sides of the laminate prior to the curing step.

According to the present invention, the moisture absorption of reinforced unsaturated polyester resin laminates using cellulosic substrates may be effectively prevented and also the punchability is improved for use as electrical laminates.

To further illustrate the invention the following non-limiting examples are presented. Unless otherwise indicated all parts and percentages are by weight.

EXAMPLE 1

To a solution of 1.5 parts of glyceryl monooleate (RIKEMAL OL-100, sold by Riken Vitamin Oil Co., Ltd.) in 50 parts of methanol was added a solution of 6 parts of methylolmelamine (NIKARESIN S-305, sold by Nippon Carbite Industry Co., Ltd.) in 50 parts of water with vigorous stirring to give a suspension.

A kraft paper of 285 μm thick was soaked in the above solution and dried at 120° C. for 20 minutes. A pick-up of 13.5% based on the dry weight of paper was obtained.

An unsaturated polyester polymer having an average molecular weight of about 3900 was prepared by reacting diethyleneglycol, isophthalic acid and maleic anhydride in a molar ratio of 3:2:1. To 62 parts of the resin polymer were mixed 38 parts of styrene monomer, 1 part of cumene hydroperoxide and 0.2 parts of 6% cobalt naphthenate.

The preimpregnated paper substrate was then impregnated with the above liquid resin and five plies of the finally impregnated paper substrates were stacked. An electrolytic copper foil of 35 μm thick was adhesively bonded onto one side of the stack with epoxy resin and the entire structure was cured at 100° C. for 45 minutes to give a copper clad laminate of 1.6 mm thick. Properties of the finished laminate are shown in Table 1.

EXAMPLE 2

A solution of 1.5 parts of oleyl alcohol in 80 parts of methanol and a solution of 6 parts of methylolmelamine (NIKARESIN S-305) in 20 parts of water were mixed to give a suspension.

The same kraft paper as used in Example 1 was preimpregnated with the above suspension to obtain a pick-up amount of 12.9%. Then Example 1 was followed to obtain a copper clad laminate of 1.6 mm thick. Properties of the finished laminate are shown in Table 1.

EXAMPLE 3

12 parts of urea-melamine-formaldehyde condensate (POLYFIX PM-138, sold Showa High Polymer Co., Ltd.) in 100 parts of water were mixed with 4 parts of a 50% emulsion of mixture of glyceryl mono-and dioleates (ATOMOS 300, Kao Soap Co., Ltd.).

The same kraft paper as used in Example 1 was soaked in the above liquid, squeezed between a pair of rollers to remove excessive liquid, and then dried at 120° C. for 20 minutes to obtain a pick-up amount of 15.1%. Then Example 1 was followed to obtain a copper clad laminate of 1.6 mm thick. Properties of the finished laminate are shown in Table 1.

CONTROL EXAMPLE

The same kraft pulp as used in Example 1 was soaked in a solution of 6 parts of methylolmelamine in 100 parts of 1:1 mixture of methanol and water, and dried at 120° C. for 20 minutes to obtain a pick-up amount of 10.3%. Then Example 1 was followed to obtain a copper clad laminate of 1.6 mm thick. Properties of the finished laminate are shown in Table 1.

The punching properties and moisture absorption rates of the finished laminates were tested in accordance with ASTM-D617 and JIS-C6481, respectively. The results are shown in Table 1.

TABLE 1

| | Ex. 1 | Ex. 2 | Ex. 3 | Control |
|---|---|---|---|---|
| Punchability (room temp.) | | | | |
| Edge | Very Good | Very Good | Very Good | Poor |
| Surface | Very Good | Very Good | Very Good | Poor |
| Hole | Very Good | Very Good | Very Good | Good |
| Moisture Absorption, % E-24/50 + D-24/23 | 0.51 | 0.55 | 0.70 | 0.52 |

The above has been offered for illustrative purposes only, and it is not for the purpose of limiting the scope of this invention, which is defined in the claims below.

We claim:

1. An electrical laminate having a cladding metal foil adhesively bonded to at least one side thereof, said laminate comprising a plurality of fibrous cellulosic sheet layers each impregnated with and joined together by a cured unsaturated polyester resin, said cellulosic sheets each having a deposit thereon in direct contact with its cellulosic fiber surface of a mixture or condensate essentially consisting of an aminoplast and a fatty derivative having at least one functional group capable of condensation with the methylol group of said aminoplast, the pick up amount of said deposit being 3 to 30% by weight of said paper sheet on dry basis.

2. The electrical laminate of claim 1, wherein said cellulosic fibrous sheet is paper.

3. The electrical laminate of claim 1 wherein said unsaturated polyester resin has, when cured, a glass transition point from 20° C. to 80° C.

4. The electrical laminate of claim 1, wherein said aminoplast is selected from methylolmelamines, methylolguanamines and a melamine-urea-formaldehyde condensate.

5. The electrical laminate of claim 4, wherein said functional group is selected from the class consisting of carboxyl, hydroxyl, amino and amido, and said high fatty derivative comprises a saturated or unsaturated hydrocarbon chain of $C_8$ to $C_{22}$ inclusive of carbonyl carbon atom.

6. The electrical laminate of claim 5, wherein said higher fatty derivative is selected from the group consisting of oleic acid, oleic amide, glyceryl monooleate, glyceryl dioleate, oleyl alcohol and oleylamine.

7. An electrical laminate having a cladding metal foil adhesively bonded to at least one side thereof, said laminate comprising a plurality of cellulosic paper sheets each impregnated with and joined together by a cured unsaturated polyester resin, said paper sheets each having a deposit thereon in direct contact with its cellulosic fiber surfaces of a mixture or condensate essentially consisting of an aminoplast selected from the group consisting of methylolmelamines, methylolguanamines and melamine/urea/formaldehyde condensate, and a higher fatty derivative selected from the group consisting of oleic acid, oleyl amide, glyceryl monooleate, glyceryl dioleate, oleyl alcohol and oleyl amine, the pick up amount of said deposit being 3 to 30% by weight of said paper sheet on dry basis, the ratio of said aminoplast to said higher fatty derivative in said deposit being 3 to 40 parts by weight of the higher fatty derivative per 100 parts by weight of the aminoplast.

* * * * *